United States Patent
Chen et al.

(10) Patent No.: US 9,728,517 B2
(45) Date of Patent: Aug. 8, 2017

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Jie Chen, New Taipei (TW); Hsien-Wei Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 110 days.

(21) Appl. No.: 14/109,192

(22) Filed: Dec. 17, 2013

(65) Prior Publication Data

US 2015/0170995 A1  Jun. 18, 2015

(51) Int. Cl.
*H01L 23/48* (2006.01)
*H01L 23/00* (2006.01)
(Continued)

(52) U.S. Cl.
CPC .............. *H01L 24/11* (2013.01); *H01L 21/56* (2013.01); *H01L 23/293* (2013.01); *H01L 23/3192* (2013.01); *H01L 23/528* (2013.01); *H01L 23/525* (2013.01); *H01L 23/5329* (2013.01); *H01L 23/53295* (2013.01); *H01L 24/13* (2013.01); *H01L 2224/02375* (2013.01); *H01L 2224/0345* (2013.01); *H01L 2224/03452* (2013.01); *H01L 2224/03462* (2013.01);
(Continued)

(58) Field of Classification Search
CPC ................. H01L 2224/13564; H01L 2224/10
See application file for complete search history.

(56) References Cited

U.S. PATENT DOCUMENTS 5,869,904 A * 2/1999 Shoji ........................ H01L 24/11
257/778
6,396,153 B2 * 5/2002 Fillion ................ H01L 21/4853
257/773
(Continued)

OTHER PUBLICATIONS

Gregg Kervill, "Practical Guide to Low Voltage Directive", chapter 9 , 1998 Elsevier Ltd, ISBN 978-0-7506-3745-9.*

*Primary Examiner* — Sitaramarao S Yechuri
(74) *Attorney, Agent, or Firm* — WPAT, P.C., Intellectual Property Attorneys; Anthony King; Kay Yang

(57) ABSTRACT

A semiconductor device includes a substrate, a pad disposed on the substrate, a passivation disposed over the substrate, a post passivation interconnection (PPI) disposed over the passivation and the substrate, a conductive line isolated from the PPI, a bump disposed on the PPI and a polymeric composite between the PPI and the conductive line, wherein the polymeric composite includes a first layer conformal to the conductive line and PPI and a second layer filling a gap between the PPI and the conductive line. Further, a method of manufacturing a semiconductor device includes providing a substrate, disposing a passivation over the substrate, forming a post passivation interconnect (PPI) and a conductive line over the passivation, disposing a bump on the PPI, and forming a polymeric composite over the PPI by disposing a first layer conformal to the PPI and the conductive line and disposing a second layer to fill a gap between the PPI and the conductive line.

20 Claims, 16 Drawing Sheets

(51) Int. Cl.
*H01L 23/29* (2006.01)
*H01L 23/31* (2006.01)
*H01L 21/56* (2006.01)
*H01L 23/528* (2006.01)
*H01L 23/525* (2006.01)
*H01L 23/532* (2006.01)

(52) U.S. Cl.
CPC ............... *H01L 2224/05016* (2013.01); *H01L 2224/05164* (2013.01); *H01L 2224/05624* (2013.01); *H01L 2224/05647* (2013.01); *H01L 2224/05666* (2013.01); *H01L 2224/05686* (2013.01); *H01L 2224/10126* (2013.01); *H01L 2224/1132* (2013.01); *H01L 2224/1146* (2013.01); *H01L 2224/1147* (2013.01); *H01L 2224/1191* (2013.01); *H01L 2224/13111* (2013.01); *H01L 2224/13116* (2013.01); *H01L 2224/13144* (2013.01); *H01L 2224/13147* (2013.01); *H01L 2224/13155* (2013.01); *H01L 2224/16148* (2013.01); *H01L 2224/81191* (2013.01); *H01L 2224/81815* (2013.01); *H01L 2924/181* (2013.01)

(56) References Cited

U.S. PATENT DOCUMENTS

| | | | | |
|---|---|---|---|---|
| 2004/0021149 | A1* | 2/2004 | Kitazawa | H01L 23/051 257/108 |
| 2005/0082670 | A1* | 4/2005 | Quinones | H01L 21/563 257/737 |
| 2006/0160347 | A1* | 7/2006 | Nakayama | H01L 21/4853 438/612 |
| 2006/0246703 | A1* | 11/2006 | Daubenspeck | H01L 23/556 438/612 |
| 2007/0018322 | A1* | 1/2007 | Park | H01L 23/3192 257/738 |
| 2007/0037319 | A1* | 2/2007 | Chan | H01L 21/6835 438/108 |
| 2007/0108573 | A1* | 5/2007 | Chung | H01L 23/3114 257/678 |
| 2009/0014869 | A1* | 1/2009 | Vrtis | H01L 24/05 257/737 |
| 2009/0045513 | A1* | 2/2009 | Kim | H01L 21/568 257/738 |
| 2009/0243118 | A1* | 10/2009 | Akiba | H01L 22/20 257/773 |
| 2013/0168859 | A1* | 7/2013 | Tanimoto | G03F 7/0226 257/738 |

* cited by examiner

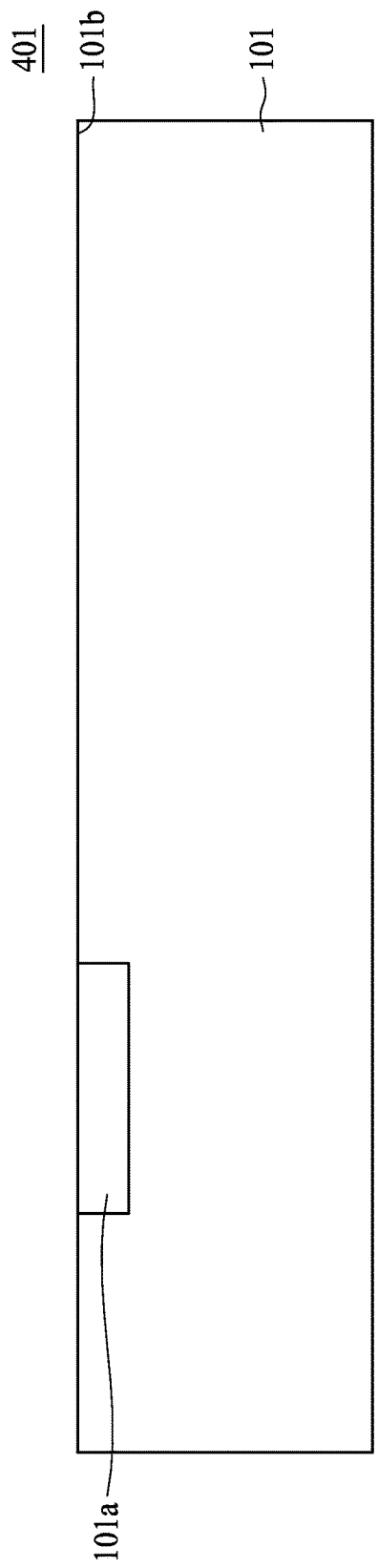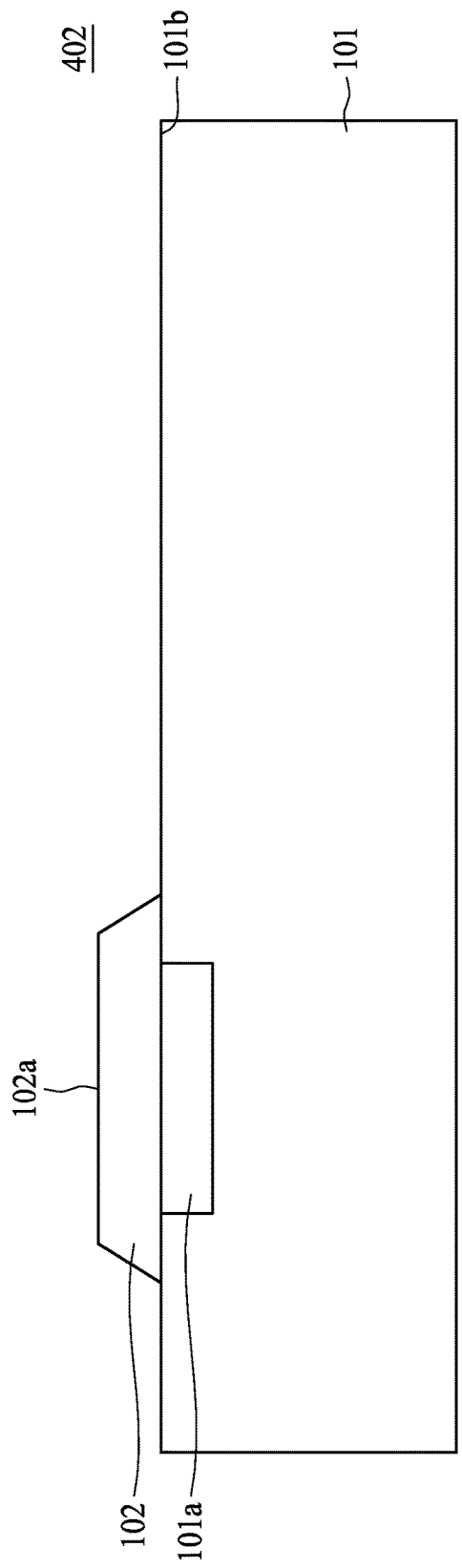

SEMICONDUCTOR DEVICE AND MANUFACTURING METHOD THEREOF

FIELD

The disclosure relates to a semiconductor device and a method of manufacturing a semiconductor device.

BACKGROUND

Electronic equipments involving semiconductor devices are indispensable from our daily life. With the advancement of electronic technology, electronic equipments become more complicated and involve greater amount of integrated circuitry for executing the desired multi-functionality. Thus, manufacturing of the electronic equipment includes more and more operations as well as various kinds of materials in order to produce the semiconductor devices in the electronic equipments. Therefore, there is a continuous demand on simplifying the steps of production, increasing a production efficiency and lowering an associated manufacturing cost on each electronic equipment.

During the operations of manufacturing the semiconductor device, the semiconductor device is assembled with numbers of integrated components including various materials. As such, the components in the semiconductor device would experience a stress after a period of time, particularly at a corner region or under high humidity. The components would change in properties, deform in shape or have warpage issue. Such undesirable alteration in configuration would lead to yield loss of the semiconductor device, poor bondability between the components, development of cracks, delamination of the components or etc. Furthermore, the components of the semiconductor device includes various metallic materials which are in limited quantity and thus in a high cost. The undesired configurations of the components and the yield loss of the semiconductor would further exacerbate materials wastage and thus the manufacturing cost would increase.

As more different components with different materials are involved and a complexity of the manufacturing operations of the semiconductor device is increased, there are more challenges to modify a structure of the semiconductor device and improve the manufacturing operations. As such, there is a continuous need to improve the method for manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4A is a schematic view of a substrate with a metallic structure in accordance with some embodiments of the present disclosure.

FIG. 4B is a schematic view of a pad on a substrate in accordance with some embodiments of the present disclosure.

DETAILED DESCRIPTION OF THE DISCLOSURE

Figure 1:
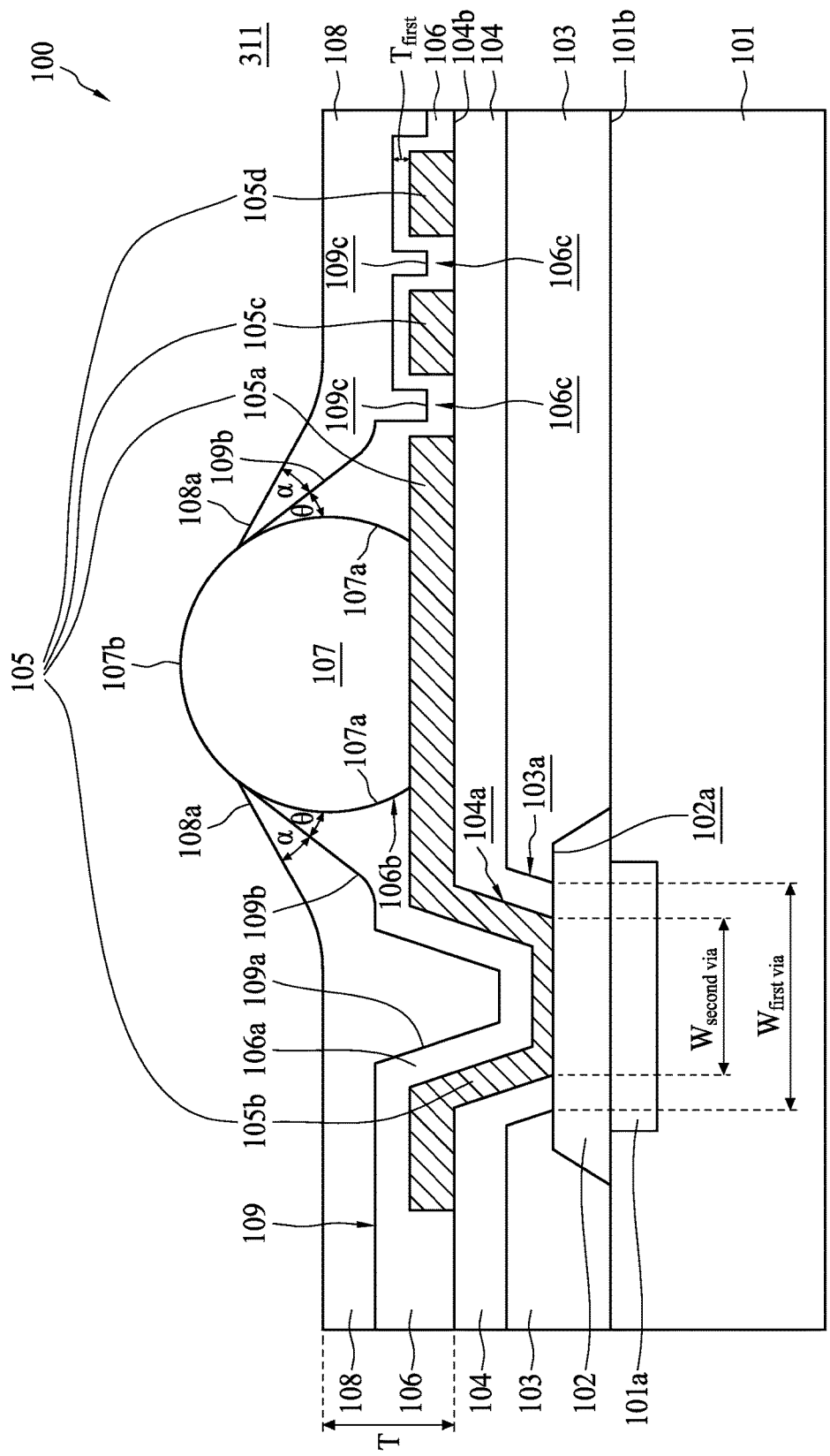
FIG. 1 is a schematic view of a semiconductor device in accordance with some embodiments of the present disclosure.

A semiconductor device is manufactured by a number of operations. During the manufacturing, a dielectric layer including a polymer is disposed over a substrate, and a post passivation interconnect (PPI) is disposed over the dielectric layer. The PPI is configured for electrically connecting a circuitry within a substrate with a circuitry external to the substrate through a conductive bump directly disposed on the PPI. The PPI is covered by a molding. Thus, the PPI is surrounded by different materials such as the molding and the polymer which have different physical properties.

Therefore, interfacing different materials would develop an electrical stress between the materials after a period of time or under a humidity environment, and thus would cause leakage of electricity or discharge of the materials within the semiconductor device.

Furthermore, the discharge of the materials would melt and fuse different materials together, which would develop a hot spot between the materials and burn out the materials, and thus would lead to a shortage of the circuitry and a failure of electrical connection within the semiconductor device. Therefore, it is necessary to modify a structure of the semiconductor device in order to prevent melting of materials and extend a life span of the semiconductor device.

In the present disclosure, a semiconductor device with a structural improvement is disclosed. The semiconductor device includes a protection layer between the PPI and the molding. The protection layer includes polymeric material to insulate the PPI from the molding. The polymeric protection layer is disposed conformal to the PPI by spin coating. As the PPI is separated from the molding by the protection layer, melting of the PPI and the molding is prevented. Thus, the electrical stress or the hot spot would not be developed between the molding and the PPI, and the shortage of the electrical connection of the PPI is avoided. Therefore, a reliability of the electrical connection within the semiconductor device is improved and the life span of the semiconductor device is extended.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is an embodiment of a semiconductor device 100. The semiconductor device 100 includes a substrate 101. In some embodiments, the substrate 101 includes silicon, germanium, gallium, arsenic, and combinations thereof. In some embodiments, the substrate 101 includes a layer of a semiconductor material such as silicon, germanium and/or the like formed over an insulator layer such as buried oxide formed in the substrate. In some embodiments, the substrate 101 is multi-layered substrates, gradient substrates, hybrid orientation substrates, any combinations thereof and/or the like.

In some embodiments, the substrate 101 includes several electrical circuits formed within the substrate 101 for a particular application. In some embodiments, the electrical circuits include various n-type metal-oxide semiconductor (NMOS) and/or p-type metal-oxide semiconductor (PMOS) devices such as transistors, capacitors, resistors, diodes and/or the like. In some embodiments, the electrical circuits are interconnected to perform one or more functions such as memory, sensors, amplifiers, input/output circuitry and/or the like.

In some embodiments, the substrate 101 includes a metallic structure 101a within the substrate 101. In some embodiments, the metallic structure 101a is disposed on a surface 101b of the substrate 101. In some embodiments, the metallic structure 101a includes gold, silver, copper, nickel, tungsten, aluminum, palladium and/or alloys thereof. In some embodiments, the metallic structure 101a is a top metal interconnect or a top metal contact for electrically connecting a circuitry external to the substrate 101. In some embodiments, the metallic structure 101a is connected with the electrical circuits within the substrate 101.

In some embodiments, the substrate 101 includes a pad 102 disposed on a surface 101b of the substrate 101. In some embodiments, the pad 102 is electrically connected with a circuitry external to the substrate 101, so that a circuitry internal to the substrate 101 electrically connects with the circuitry external to the substrate 101 through the pad 102. In some embodiments, the pad 102 is configured for receiving a conductive trace coupled with a conductive bump, so that the substrate 101 electrically connects with a circuitry external to the substrate 101 through the pad 102, the conductive trace and the conductive bump. In some embodiments, the pad 102 includes gold, silver, copper, nickel, tungsten, aluminum, palladium and/or alloys thereof.

In some embodiments, a passivation 103 is disposed on the surface 101b of the substrate 101 and over the pad 102. In some embodiments, the passivation 103 surrounds the pad 102. In some embodiments, the passivation 103 partially covers a top surface 102a of the pad 102. The passivation 103 is configured for providing an electrical insulation and a moisture protection for the substrate 101, so that the substrate 101 is isolated from ambient environment.

In some embodiments, the passivation 103 is formed with dielectric materials such as spin-on glass (SOG), silicon oxide, silicon oxynitride, silicon nitride or the like. In some embodiments, the passivation 103 is formed with a vapor deposition or a spin coating process.

In some embodiments, the passivation 103 includes a first via 103a above the pad 102 for exposing a portion of the top surface 102a of the pad 102, and thus for electrically connecting the pad 102 with the circuitry external to the substrate 101 through the conductive trace. In some embodiments, the first via 103a is tapered towards the top surface 102a of the pad 102.

In some embodiments, a polymer 104 is disposed over the passivation 103. In some embodiments, some of the polymer 104 is surrounded by the first via 103a. In some embodiments, the polymer 104 is substantially vertically aligned with the passivation 103. In some embodiments, the polymer 104 includes a polymeric material such as epoxy, polyimide, polybenzoxazole (PBO), benzocyclobutene (BCB) or etc.

In some embodiments, the polymer 104 includes a second via 104a. In some embodiments, the second via 104a is surrounded by the first via 103a. In some embodiments, the second via 104a is tapered towards the top surface 102a.

In some embodiments, the second via 104a is conformal to a profile of the first via 103a. In some embodiments, the second via 104a has a width $W_{second\ via}$ smaller than a width $W_{first\ via}$ of the first via 103a. In some embodiments, the second via 104a is offset from the first via 103a.

In some embodiments, a post passivation interconnect (PPI) 105 is disposed on the polymer 104 and over the passivation 103 and the substrate 101. The PPI 105 re-routes a path of a circuit from the pad. In some embodiments, the PPI 105 is a single material layer or a multi-layered conductive structure. In some embodiments, the PPI 105 includes copper, aluminum, titanium, titanium nitride, copper alloy or other mobile conductive materials. In some embodiments, the PPI 105 is disposed by electroplating, sputtering, physical vapor deposition (PVD), chemical vapor deposition (CVD) or other suitable methods.

In some embodiments, the PPI 105 includes a pad portion 105a and a via portion 105b. The pad portion 105a is coupled with the via portion 105b. In some embodiments, the pad portion 105a extends horizontally along a surface 104b of the polymer 104. In some embodiments, the via portion 105b is disposed within the first via 103a of the passivation 103 and the second via 104a of the polymer 104. In some embodiments, the via portion 105b is conformal to a profile of the second via 104a. In some embodiments, the via portion 105b is in a V shape.

In some embodiments, the PPI 105 includes a conductive line (105c, 105d) over the passivation 103 and the substrate 101. In some embodiments, the conductive line (105c, 105d) is disposed on the polymer 104 and is extended horizontally along the surface 104b of the polymer 104. In some embodiments, the conductive line (105c, 105d) is electrically isolated from the pad portion 105a and the via portion 105b of the PPI 105.

Figure 1A:
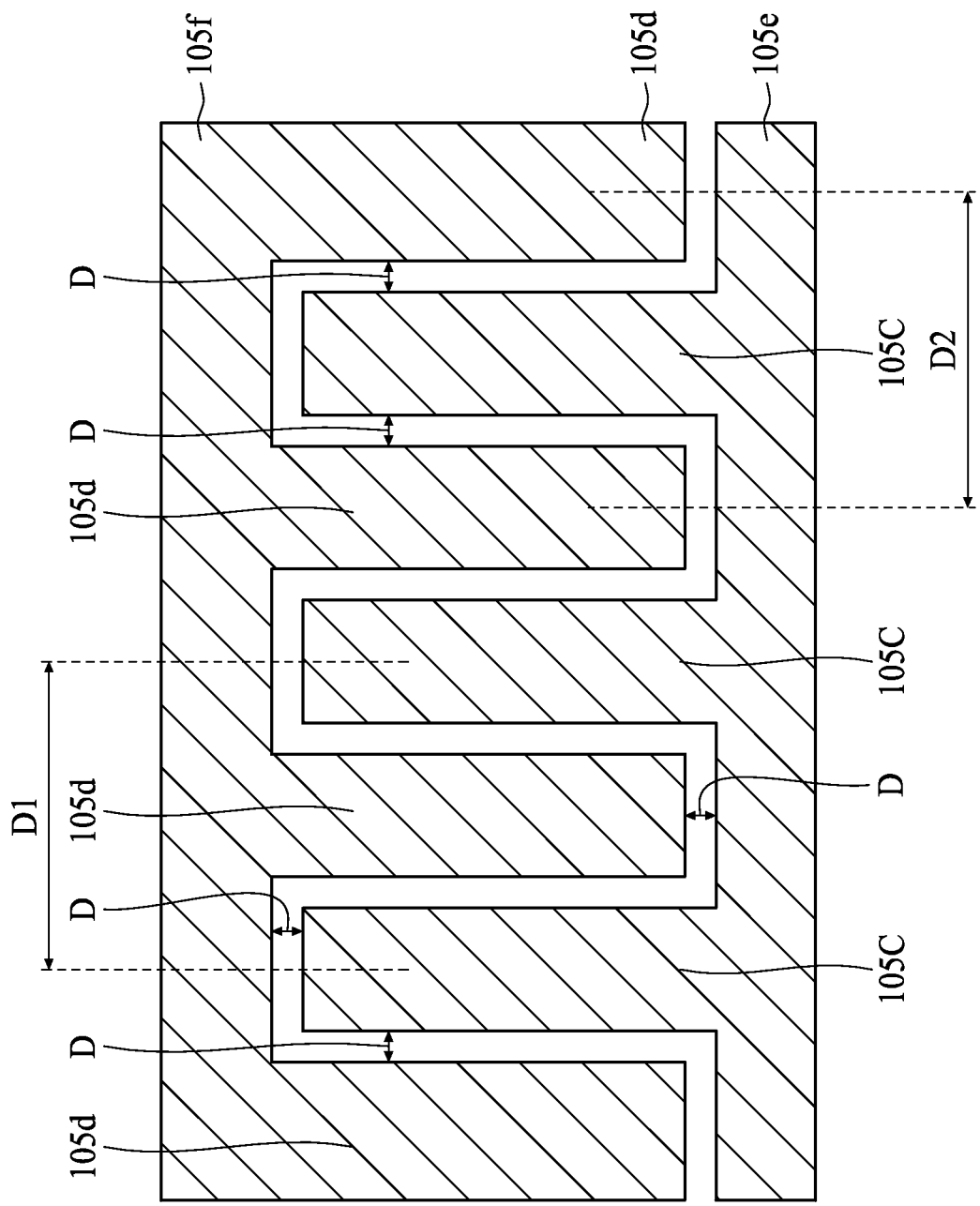
FIG. 1A is a schematic view of several conductive lines interleaved with each other in accordance with some embodiments of the present disclosure.

In some embodiments, the conductive line (105c, 105d) includes several elongated members as in FIG. 1A which is a top view of the conductive line of FIG. 1. The elongated members include first elongated members 105c and second elongated members 105d interleaved with the first elongated members 105c.

In some embodiments, the first elongated members 105c are coupled with each other, and the second elongated members 105d are coupled with each other. In some embodiments, each of the first elongated members 105c is connected and extended from a first bar 105e, and each of the second elongated members 105d is connected and extended from a second bar 105f.

In some embodiments, the first elongated members 105c are electrically isolated from the second elongated members 105d. In some embodiments, each of the first elongated members 105c is spaced from each of the second elongated members 105d in a constant distance D along a profile of the first elongated members 105c and the second elongated members 105d. In some embodiments, the distance D is about 7 um to about 15 um.

In some embodiments, the first elongated members 105c are in similar configuration as the second elongated members 105d. In some embodiments, a spacing D1 between each of the first elongated members 105c is substantially same as a spacing D2 between each of the second elongated members 105d. In some embodiments, each of the first elongated members 105c and the second elongated members 105d is in a rectangular or quadrilateral shape.

Referring back to FIG. 1, a polymeric composite (106, 108) is disposed over the PPI 105, the polymer 104 and the passivation 103. The PPI 105 is surrounded by the polymeric composite (106, 108). In some embodiments, the polymeric composite (106, 108) includes at least two different kinds of polymeric materials such as molding compound, polymer, epoxy, polyimide or polybenzoxazole (PBO). In some embodiments, the polymeric composite (106, 108) has a thickness T of about 2 um to about 10 um.

In some embodiments, the polymeric composite (106, 108) includes a first layer 106. In some embodiments, the first layer 106 is a polymeric layer conformal to the PPI 105.

In some embodiments, the polymeric layer 106 is disposed on the pad portion 105a, the via portion 105b and the conductive line (150c, 105d).

In some embodiments, the polymeric layer 106 is a protection film for covering and protecting the PPI 105 from the surrounding. In some embodiments, the conductive line (105c, 105d) is electrically isolated from the pad portion 105a and the via portion 105b by the polymeric composite (106, 108). In some embodiments, the polymeric layer 106 has a thickness $T_{first}$ of about 2 um to about 5 um around the conductive line (105c, 105d).

In some embodiments, the polymeric layer 106 includes a first recessed portion 106a disposed within the via portion 105b, the first via 103a and the second via 104a. In some embodiments, the first recessed portion 106a of the polymeric layer 106 is conformal to a profile of the via portion 105b. In some embodiments, the first recessed portion 106a is tapered towards the top surface 102a of the pad 102.

In some embodiments, the polymeric layer 106 includes a second recessed portion 106b. In some embodiments, the second recessed portion 106b is disposed above the pad portion 105a. In some embodiments, the second recessed portion 106b is configured for receiving a bump 107 attached on the pad portion 105a. The bump 107 fills the second recessed portion 106b.

In some embodiments, the second recessed portion 106b is conformal to an encapsulated portion 107a of an outer surface of the bump 107. In some embodiments, the bump 107 is partially surrounded by the polymeric layer 106. There is an exposed portion 107b of the bump 107 exposing from the polymeric layer 106. In some embodiments, the second recessed portion 106b is in a bowl shape.

In some embodiments, the polymeric layer 106 includes at least one third recessed portion 106c between the conductive line (105c, 105d). In some embodiments, the third recessed portion 106c is disposed between the pad portion 105a and the conductive line (105c, 105d). In some embodiments, the third recessed portion 106c is disposed between each of the first elongated members 105c and each of the second elongated members 105d. The third recessed portion 106c is within the spacing D. In some embodiments, the third recessed portion 106c is conformal to a profile of each of the first elongated members 105c and each of the second elongated members 105d. In some embodiments, the third recessed portion 106c is disposed between the pad portion 105a and the first elongated member 105c. In some embodiments, the third recessed portion is disposed between the pad portion 105a and the second elongated member 105d.

In some embodiments, the polymeric composite (106, 108) includes a second layer 108. In some embodiments, the second layer 108 is a molding. The molding 108 is disposed on the polymeric layer 106. In some embodiments, the molding 108 fills a gap between the pad portion 105a, the via portion 105b and the conductive line (105c, 105d). In some embodiments, the molding 108 has properties of a high thermal conductivity, a low moisture absorption rate, a high flexural strength at board-mounting temperatures, or a combination of these.

In some embodiments, the molding 108 is disposed to flatten a surface of the polymeric layer 106. Some of the molding 108 fills the first recessed portion 106a and the third recessed portion 106c of the polymeric layer 106. In some embodiments, the molding 108 surrounds the encapsulated portion 107a of the bump 107, while the exposed portion 107b is exposed form the molding 108.

In some embodiments, there is an interface 109 between the polymeric layer 106 and the molding 108. In some embodiments, the interface 109 includes a recessed portion 109a, a curved portion 109b and a stepped portion 109c. In some embodiments, the recessed portion 109a is extended within the via portion 105b and the first recessed portion 106a of the polymeric layer 106. In some embodiments, the recessed portion 109a extends towards a bottom of the via portion 105b. In some embodiments, the recessed portion 109a is conformal to a profile of the first recessed portion 106a.

In some embodiments, the curved portion 109b has a curvature ramping from the pad portion 105a of the PPI to the outer surface of the bump 107. In some embodiments, the curved portion 109b surrounds the bump 107. In some embodiments, the curved portion 109b is in a shape of an exponential curve or a bell shaped curve. In some embodiments, the angle θ is disposed between the curved portion 109b and the outer surface of the bump 107.

In some embodiments, the stepped portion 109c is conformal to an outer surface of the conductive line (105c, 105d). The stepped portion 109c is disposed between the conductive line (105c, 105d). In some embodiments, the stepped portion 109c is disposed between the pad portion 105a and the conductive line (105c, 105d). In some embodiments, the stepped portion 109c is disposed within the third recessed portion 106c of the polymeric layer 106.

In some embodiments, there in an angle θ between the outer surface of the bump 107 and the curved portion 109b of the interface 109. In some embodiments, the curved portion 109b of the interface 109 surrounds the encapsulated portion 107a of the outer surface of the bump 107. In some embodiments, the angle θ is about 10 degree to about 85 degree.

In some embodiments, the curved portion 109b of the interface 109 is continuously coupled with the recessed portion 109a and the stepped portion 109c, so as to conformal to profiles of the pad portion 105a, the via portion 105b, the first elongated member 105c and the second elongated member 105d.

In some embodiments, the molding 108 has a curved surface 108a adjacent to the outer surface of the bump 107. The curved surface 108a of the molding 108 is curved upward and towards the outer surface of the bump 107. In some embodiments, there is an angle α between the curved portion 109b of the interface 109 and the curved surface 108a of the molding 108. In some embodiments, the angle α is about 10 degree to about 85 degree. In some embodiments, the angle α is substantially same as the angle θ.

As the PPI 105 is covered by the polymeric layer 106 and is isolated from the molding 108, the conductive line (105c, 105d) is prevented from development of an electrical stress after a period of time or under a humidity environment, particular at a corner or an edge of the conductive line (105c, 105d). Thus, melting or discharge of the conductive line (105c, 105d) is prevented by the coverage of the polymeric layer 106, and the conductive line (105c, 105d) would not fuse together.

Figure 2:
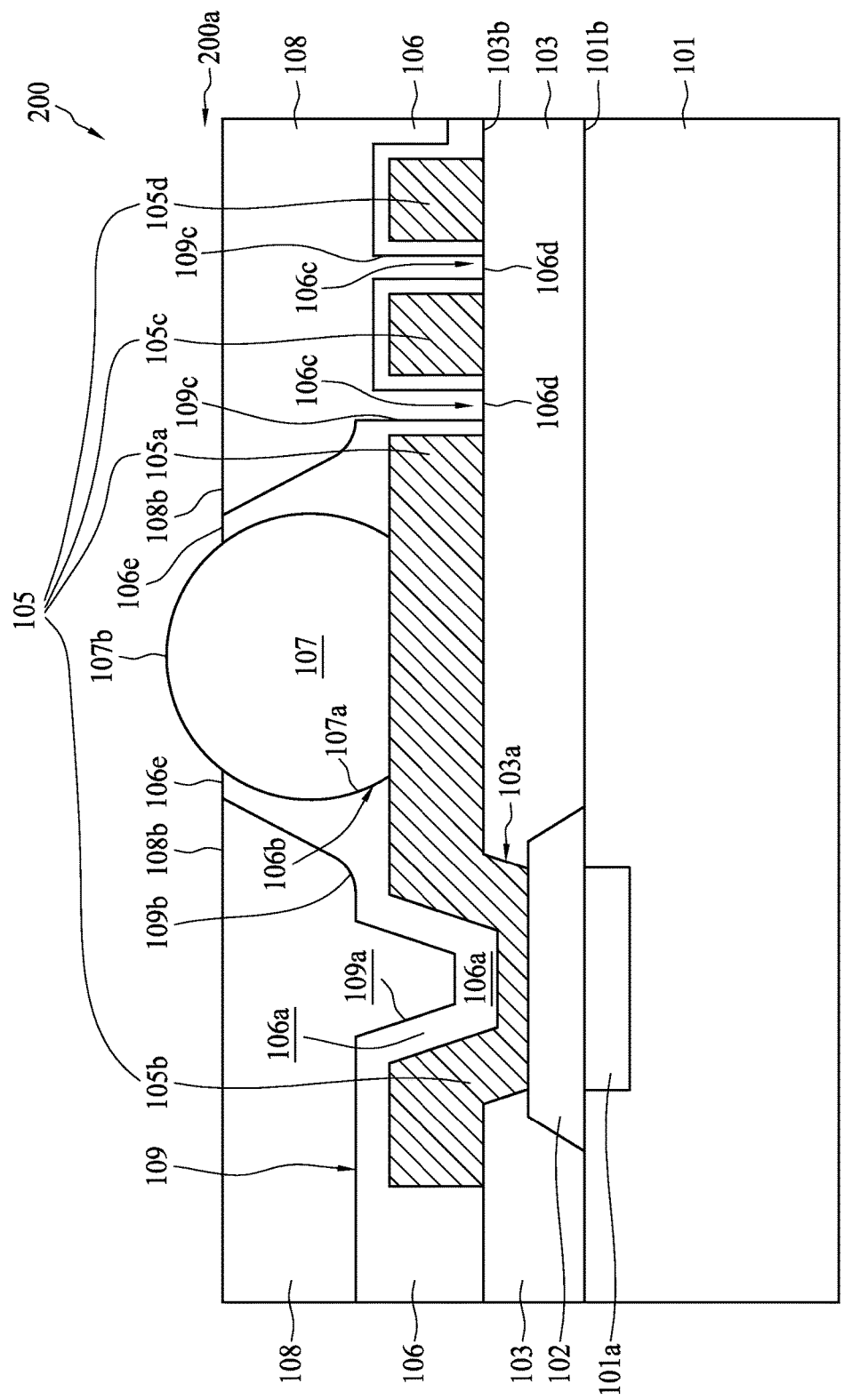
FIG. 2 is a schematic view of a semiconductor device in accordance with some embodiments of the present disclosure.

FIG. 2 is an embodiment of a semiconductor device 200. In some embodiments, the semiconductor device 200 includes a substrate 101, a metallic structure 101a, a pad 102 and a passivation 103, which are in similar configurations as in FIG. 1.

In some embodiments, the semiconductor device 200 does not include a polymer 104 as the semiconductor device of FIG. 1, that is the semiconductor device 200 includes a PPI 105 directly disposed on the passivation 103 as in FIG. 2. In some embodiments, the PPI 105 includes a pad portion 105, a via portion 105b and a conductive line (105c, 105d).

In some embodiments, the pad portion 105a extends horizontally along a surface 103b of the passivation 104 and couples with the via portion 105b at an end of the pad portion 105a. In some embodiments, the pad portion 105a is configured for receiving a bump 107

In some embodiments, the via portion 105b is disposed within a first via 103a of the passivation 103. In some embodiments, the via portion 105b is conformal to a profile of the first via 103a. In some embodiments, the via portion 105b is in a V shape.

In some embodiments, the conductive line (105c, 105d) of the PPI 105 is disposed on the passivation 103. In some embodiments, the conductive line (105c, 105d) extends horizontally along the surface 103b of the passivation 103. In some embodiments, the conductive line (105c, 105d) is electrically isolated from the pad portion 105a and the via portion 105b.

In some embodiments, the conductive line (105c, 105d) has similar configuration as in FIG. 1A. The conductive line (105c, 105d) includes several first elongated members 105c and several second elongated members 105d which are disposed on the passivation 104 and interleaved with each other. In some embodiments, the first elongated members 105c are coupled with each other by a first bar 105e, and the second elongated members 105d are coupled with each other by a second bar 105f.

Referring back to FIG. 2, in some embodiments, a polymeric composite (106, 108) is disposed to cover the PPI 105. In some embodiments, the polymeric composite (106, 108) includes the polymeric layer 106 directly disposed on the PPI 105. In some embodiments, the polymeric layer 106 includes a first recessed portion 106a and a second recessed portion 106b, which are in similar configuration as in FIG. 1.

In some embodiments as in FIG. 2, the polymeric layer 106 includes a third recessed portion 106c. In some embodiments, the third recessed portion 106c is disposed between the conductive line (105c, 105d). In some embodiments, the third recessed portion 106c is disposed between the pad portion 105a and the conductive line (105c, 105d). In some embodiments, the third recessed portion 106c has a bottom surface 106d coplanar with the surface 103b of the passivation 103. As such, the polymeric layer 106 is discontinuous between the conductive line (105c, 105d), or the polymeric layer 106 is discontinuous between the pad portion 105a and the conductive line (105c, 105d).

In some embodiments, the polymeric composite (106, 108) includes a molding 108 disposed on the polymeric layer 106. In some embodiments, the molding 108 fills the first recessed portion 106a and the third recessed portion 106c. In some embodiments, a portion of the molding 108 within the third recessed portion 106c is disposed on the surface 103b of the passivation 103. The portion of the molding 108 is contacted with the passivation 103.

In some embodiments, the molding 108 has a flat surface 108b along a backside 200a of the semiconductor device 200 opposite to the substrate 101. In some embodiments, the polymeric layer 106 has a flat surface 106e surrounding the bump 107. In some embodiments, the flat surface 106e of the polymeric layer 106 is at a substantially same level as the flat surface 108b of the molding 108.

Figure 3:
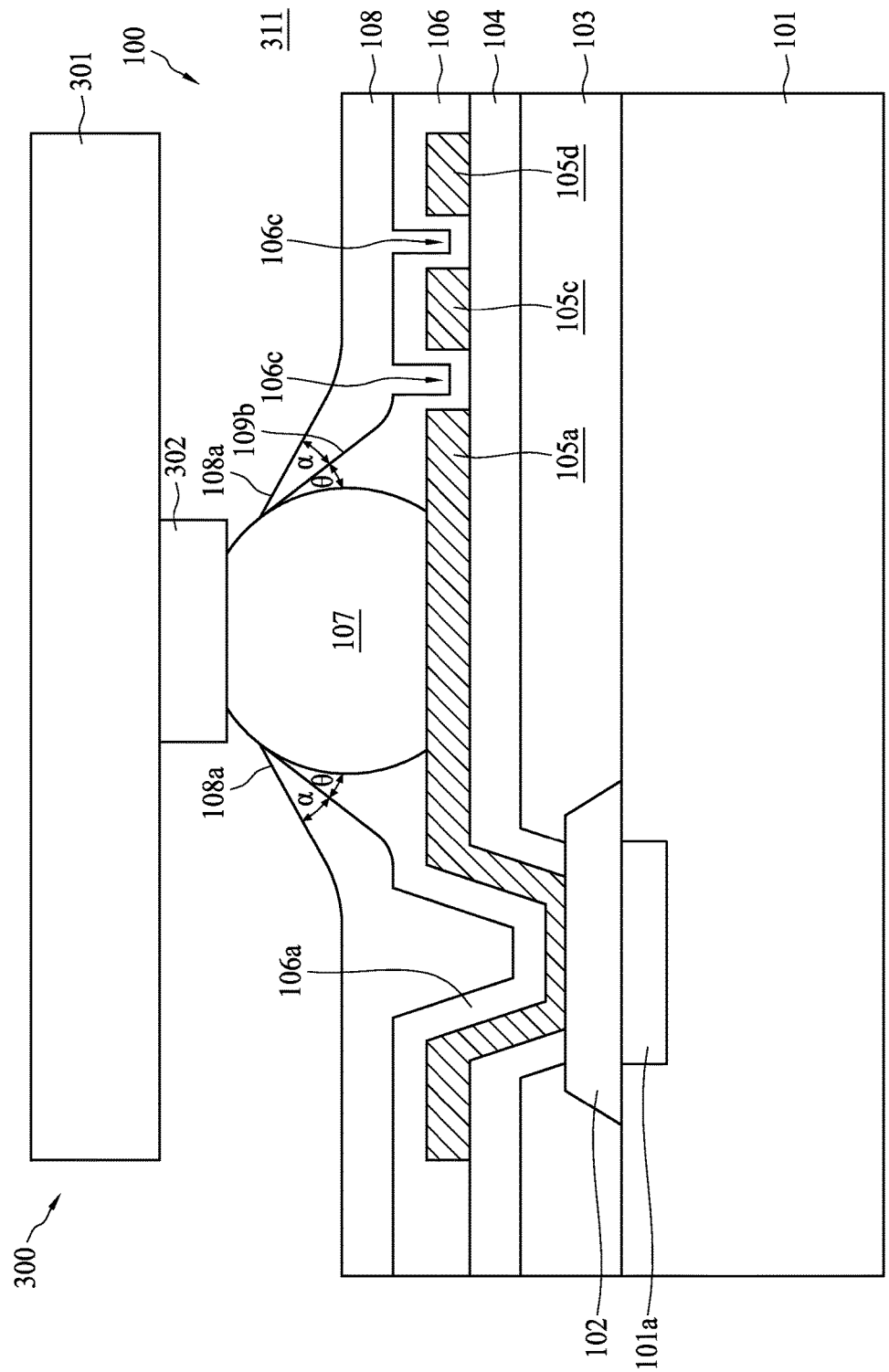
FIG. 3 is a schematic view of a semiconductor device bonded with another semiconductor device in accordance with some embodiments of the present disclosure.

FIG. 3 is an embodiment of a semiconductor device 100 bonded with another semiconductor device 300. In some embodiments, the semiconductor device 300 is a semiconductor package, a printed circuit board (PCB) or etc. In some embodiments, the semiconductor device 300 includes a substrate 301 and a pad 302 disposed on the substrate 301.

In some embodiments, the substrate 301 includes a circuit within the substrate 301. In some embodiments, the substrate 301 includes silicon, ceramic, copper or etc.

In some embodiments, the pad 302 is electrically connected with the circuit within the substrate 301. In some embodiments, the pad 302 is configured for receiving a conductive bump. In some embodiments, the pad 302 includes chromium (Cr), copper (Cu), gold (Au), titanium (Ti) or tungsten (W), etc.

In some embodiments, the semiconductor device 300 is mounted on the semiconductor device 100 by bonding a bump 107 of the semiconductor device 100 with the pad 302 of the semiconductor device 300. The bump 107 is attached with the pad 302, so that the circuit within the substrate 101 of the semiconductor device 100 is electrically connected with the circuit within the substrate 301 of the semiconductor device 300 through the pad 102, the PPI 105, the bump 107 and the pad 302.

In some embodiments, after bonding the semiconductor device 100 and the semiconductor device 300, a semiconductor package is formed as a final product or as an intermediate product for subsequent operations. In some embodiments, when both semiconductor devices 100 and 300 are a package respectively, a package on package (PoP) is formed.

In the present disclosure, a method of manufacturing a semiconductor device is also disclosed. In some embodiments, a semiconductor device is formed by a method 300. The method 300 includes a number of operations and the description and illustration are not deemed as a limitation as the sequence of the operations.

Figure 4:
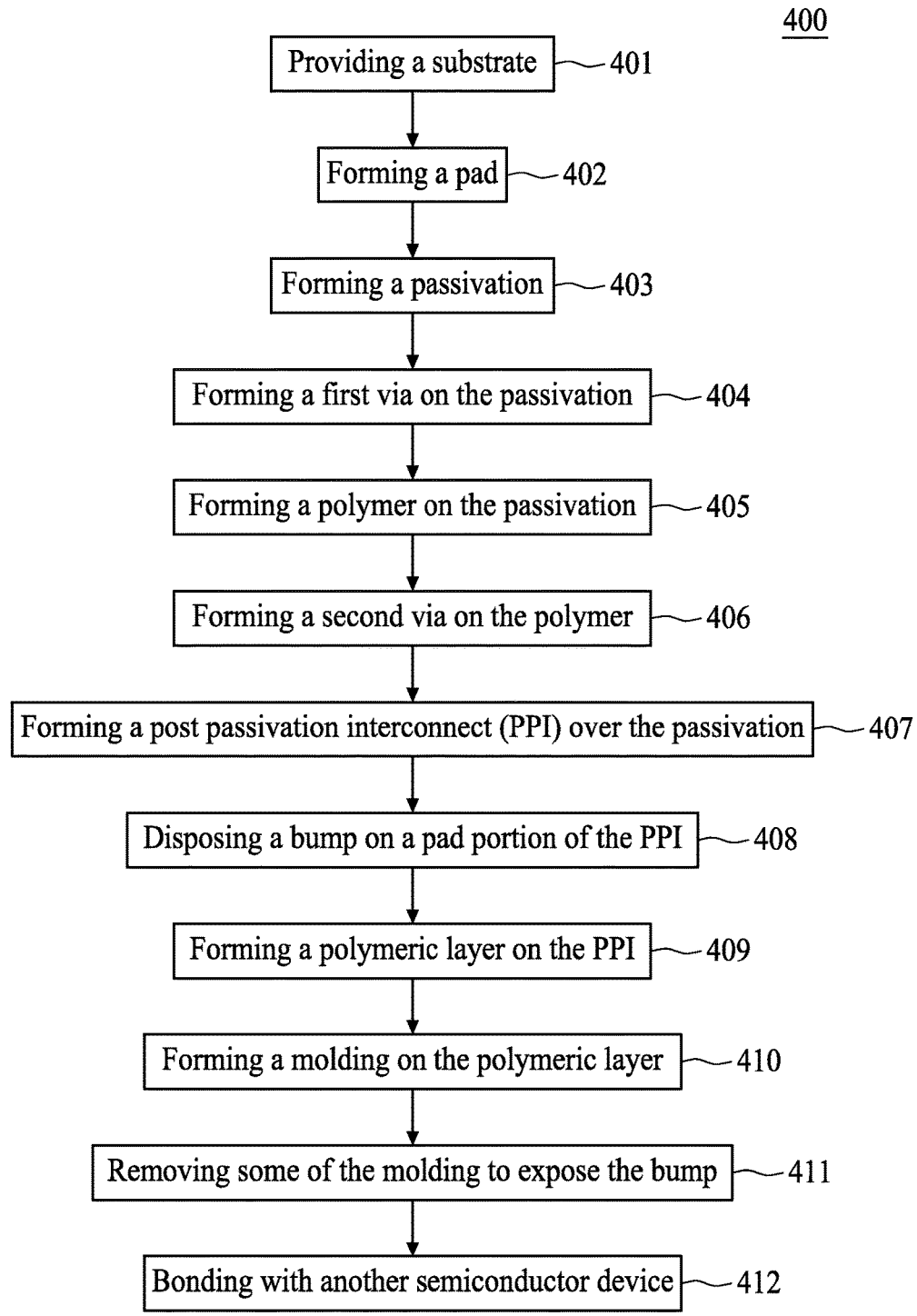
FIG. 4 is a flow diagram of a method of manufacturing a semiconductor device in accordance with some embodiments of the present disclosure.

FIG. 4 is an embodiment of a method 400 of manufacturing a semiconductor device. The method 300 includes a number of operations (401, 402, 403, 404, 405, 406, 407, 408, 409, 410, 411 and 412).

In operation 401, a substrate 101 is provided as in FIG. 4A. In some embodiments, the substrate 101 includes silicon, ceramic, copper or etc. In some embodiments, a metallic structure 101a is formed on or within the substrate 101. In some embodiments, the metallic structure 101a is a top metal interconnect for electrically connecting a circuitry external to the substrate 101. In some embodiments, the metallic structure 101a is connected with the electrical circuits within the substrate 101.

In operation 402, a pad 102 is formed on a surface 101b of the substrate 101 as in FIG. 4B. In some embodiments, the pad 102 is electrically connected with a circuitry external to the substrate 101, so that a circuitry internal to the substrate 101 electrically connects with the circuitry external to the substrate 101 through the pad 102. In some embodiments, the pad 102 is configured for receiving a conductive trace coupled with a conductive bump, so that the substrate 101 electrically connects with a circuitry external to the substrate 101 through the pad 102, the conductive trace and the conductive bump.

Figure 4C:
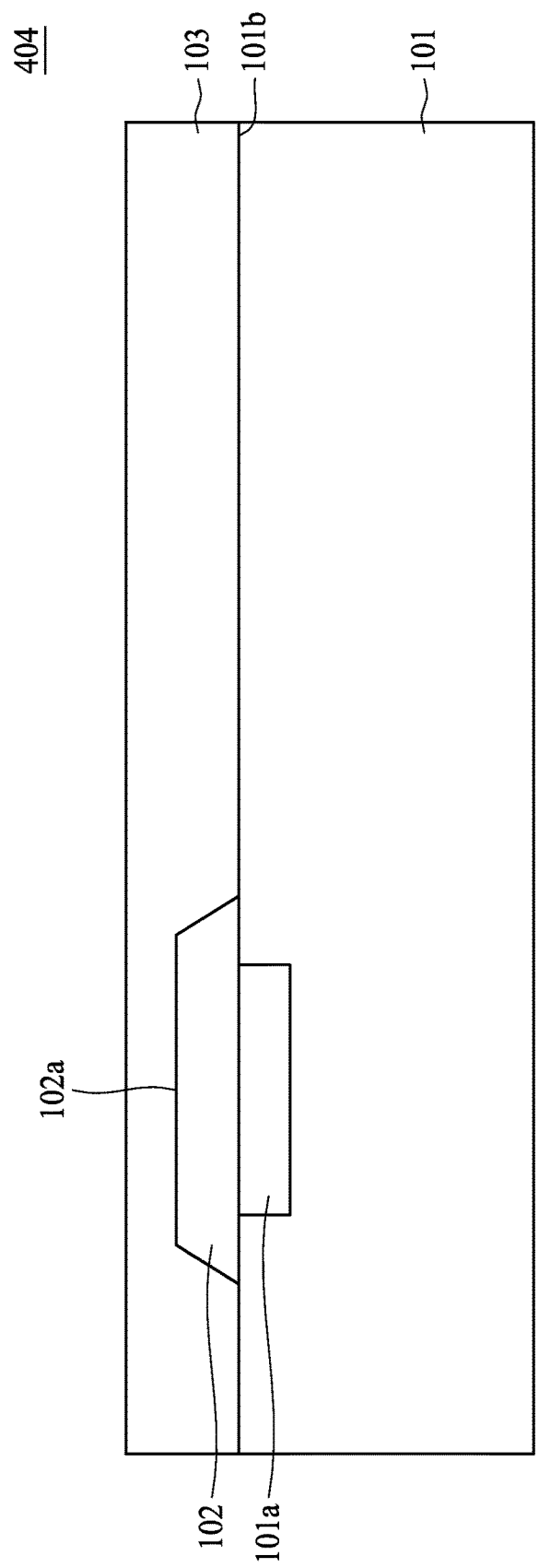
FIG. 4C is a schematic view of a passivation disposed over a substrate in accordance with some embodiments of the present disclosure.

In operation 403, a passivation 103 is formed on the pad 102 and the surface 101b of the substrate 101 as in FIG. 4C. In some embodiments, the passivation 103 covers the pad 102 and the substrate 101, so that the pad 102 and the surface 101b are isolated from the surrounding.

Figure 4D:
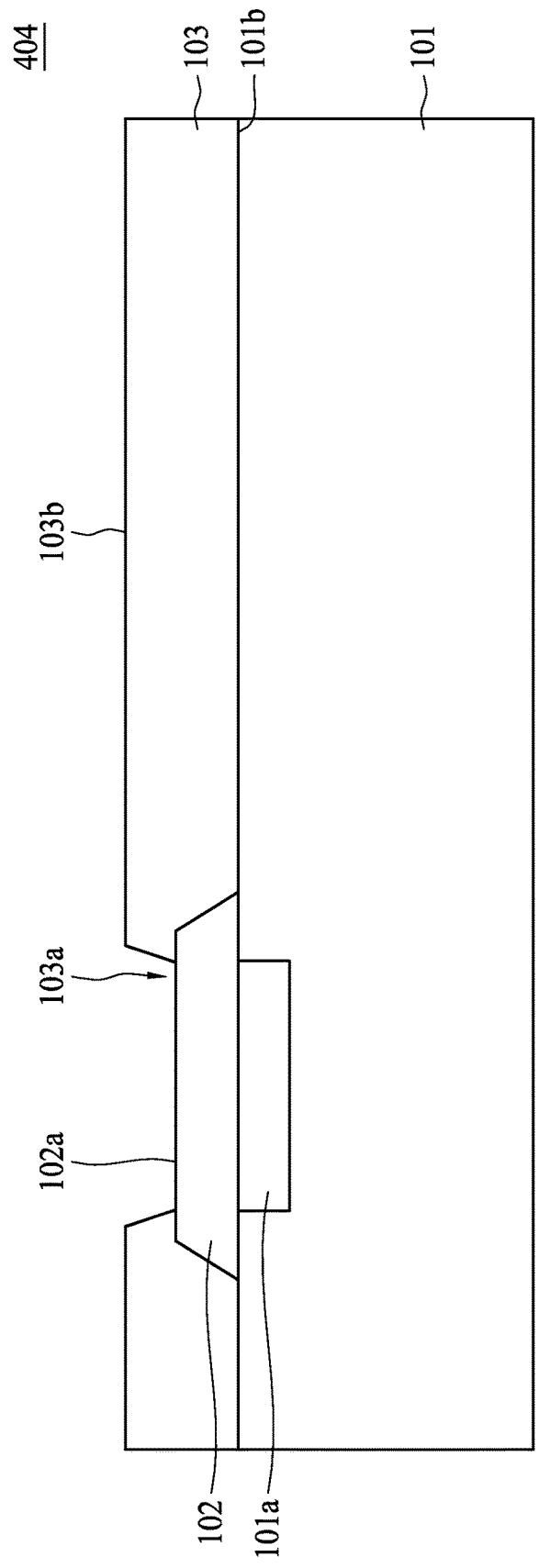
FIG. 4D is a schematic view of a passivation with a first via in accordance with some embodiments of the present disclosure.

In operation 404, a first via 103a is formed above the pad 102 as in FIG. 4D. In some embodiments, the first via 103a is disposed on the top surface 102a of the pad 102. In some embodiments, a portion of the passivation 103 above the pad 102 is removed by etching or any other suitable operations, so that the top surface 102a of the pad 102 is exposed and the first via 103a is formed above the pad 102. In some embodiments, the first via 103a is extended from a surface 103b of the passivation to the surface 102a of the pad 102. In some embodiments, a bottom of the first via 103a is coplanar with the surface 102a of the pad 102.

Figure 4E:
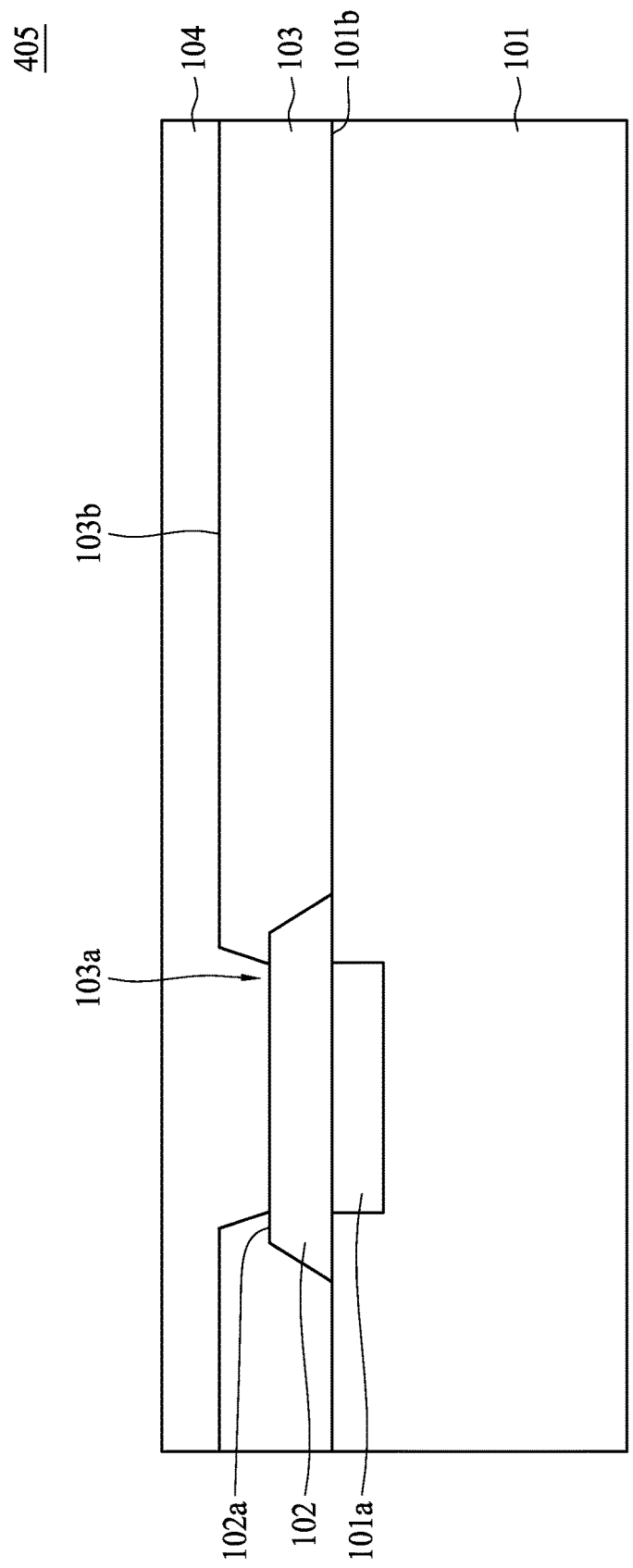
FIG. 4E is a schematic view of a polymer in accordance with some embodiments of the present disclosure.

In operation 405, a polymer 104 is formed on the passivation 103 as in FIG. 4E. In some embodiments, the polymer 104 is disposed on the surface 103b of the passivation 103 and within the first via 103a. In some embodiments, the polymer 104 includes a polymeric material such as epoxy, polyimide, polybenzoxazole (PBO), benzocyclobutene (BCB) or etc.

Figure 4F:
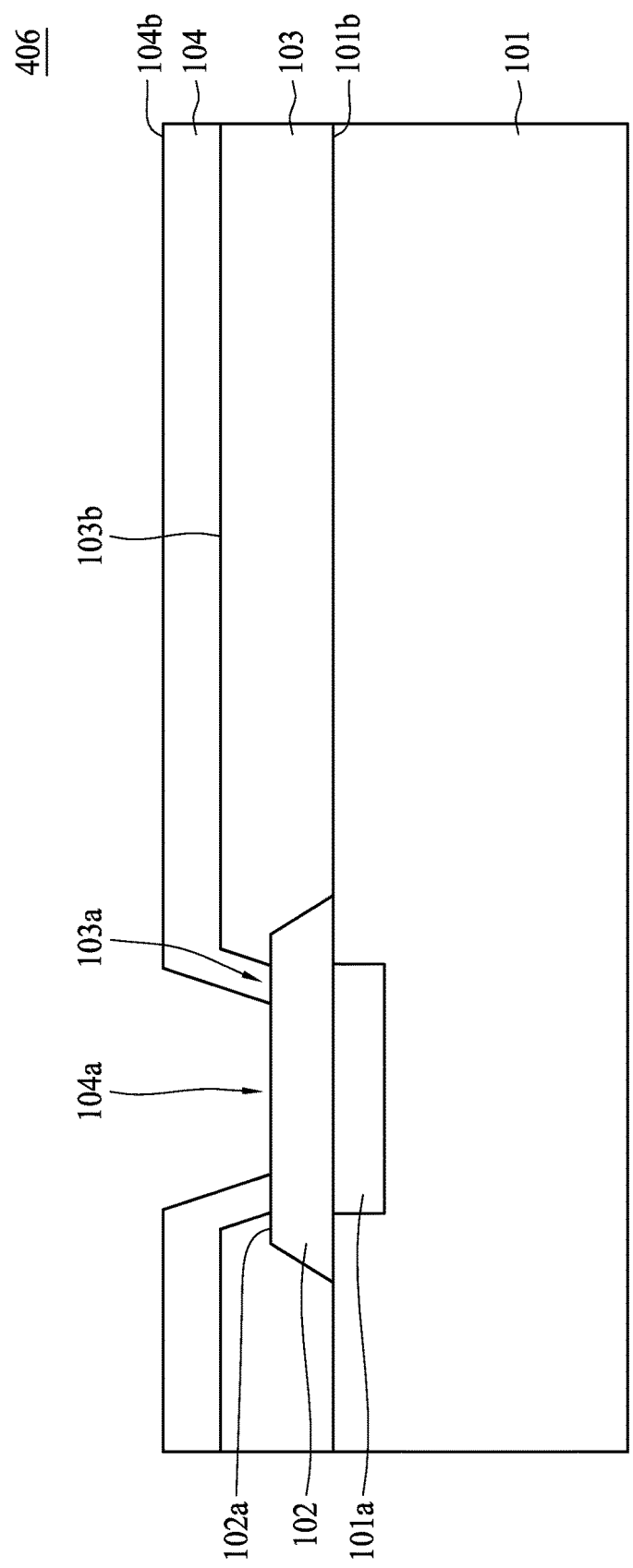
FIG. 4F is a schematic view of a polymer with a second via in accordance with some embodiments of the present disclosure.

In operation 406, a second via 104a is formed above the surface 102a of the pad 102 and within the first via 103a as in FIG. 4F. In some embodiments, the second via 104a is surrounded by the first via 103a. In some embodiments, a portion of the polymer 104 above the pad 102 is removed by etching or any other suitable operations to form the second via 104a. The second via 104a is extended from a surface 104b of the polymer 104 to the surface 102a of the pad 102. In some embodiments, a bottom of the second via 104a is coplanar with the surface 102a of the pad 102.

Figure 4G:
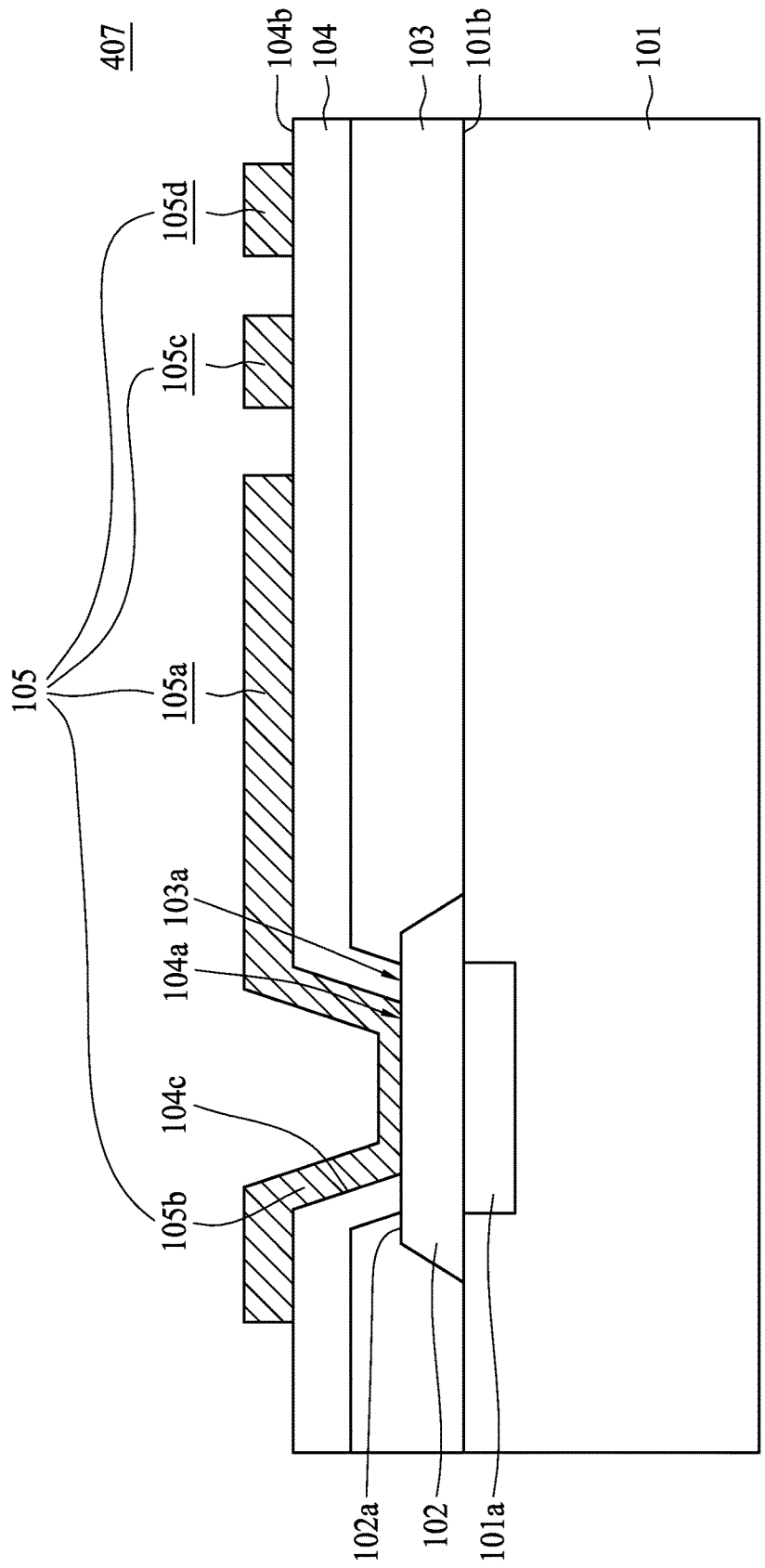
FIG. 4G is a schematic view of a post passivation interconnect (PPI) over a substrate and a passivation in accordance with some embodiments of the present disclosure.

In operation 407, a post passivation interconnect (PPI) 105 is formed on the polymer 104 and over the passivation 103 as in FIG. 4G. In some embodiments, the PPI 105 includes a pad portion 105a, a via portion 105b and a conductive line (105c, 105d), which are formed simultaneously. In some embodiments, the pad portion 105a is extended along the surface 104b of the polymer 104.

In some embodiments, the via portion 105b is formed within the first via 103a and the second via 104a. In some embodiments, a bottom of the via portion 105b is disposed on the top surface 102a of the pad 102, and a side of the via portion 105b is extended from the surface 104b towards the pad 102 along a sidewall 104c of the second via 104a.

In some embodiments, the conductive line (105c, 105d) is extended laterally on the surface 104b. In some embodiments, the conductive line (105c, 105d) is in a similar configuration as in FIG. 1A. The conductive line (105c, 105d) is separated and interleaved from each other.

Figure 4H:
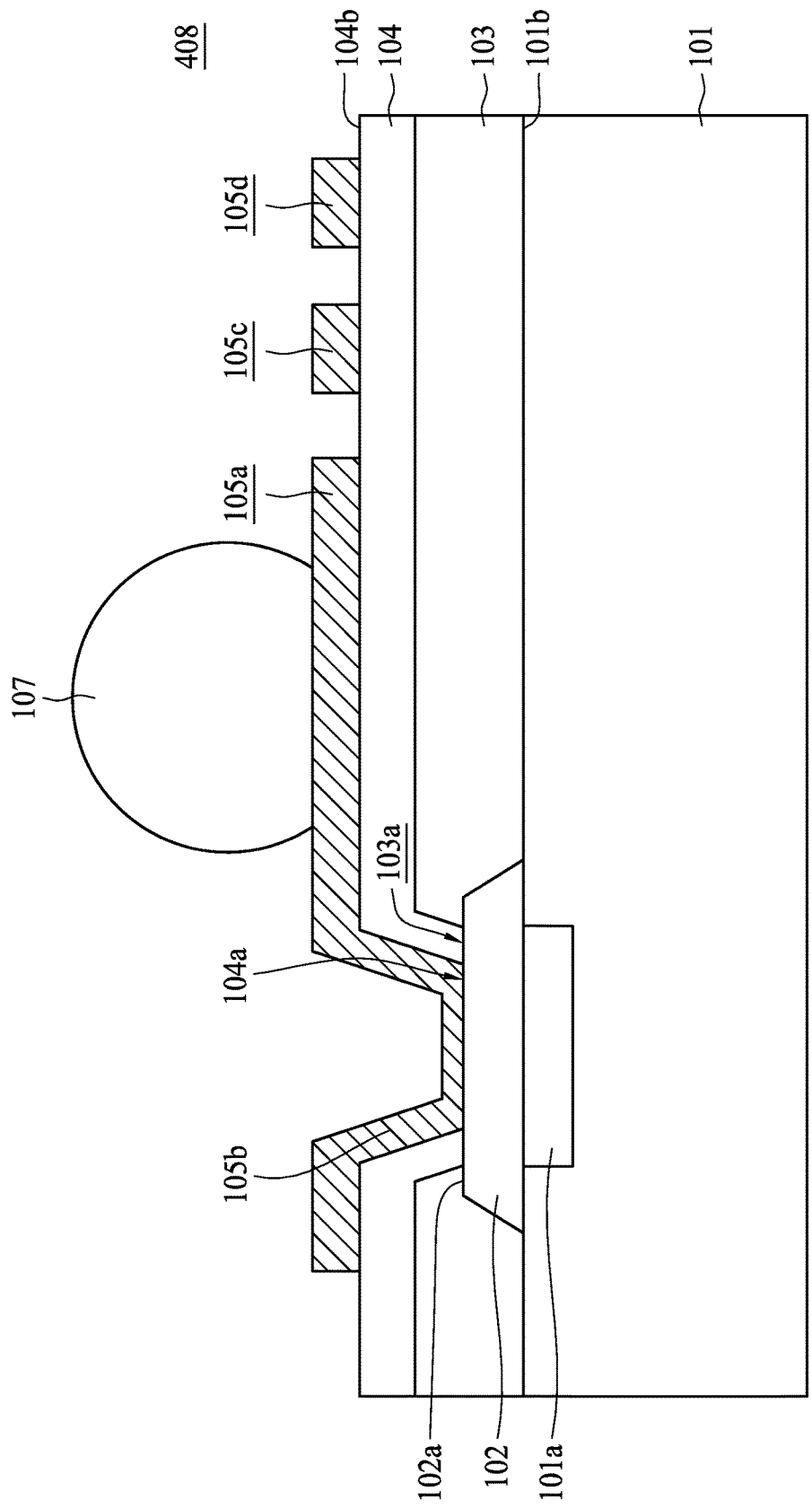
FIG. 4H is a schematic view of a bump disposed on a PPI in accordance with some embodiments of the present disclosure.

In operation 408, a bump 107 is formed on the pad portion 105a of the PPI 105 as in FIG. 4H. In some embodiments, the bump 107 is formed directly on the pad portion 105a by disposing a photoresist over the PPI 105, forming a pattern on the photoresist by photolithography, plating a solder flux according to the pattern of the photoresist, stripping a remaining photoresist and reflowing the solder flux to form the bump 107.

In some embodiments, the bump 107 is placed on the pad portion 105a using a stencil. In some embodiments, the bump 107 includes metal such as lead, tin copper, gold, nickel, etc. or metal alloy such as combination of lead, tin copper, gold, nickel, etc.

Figure 4I:
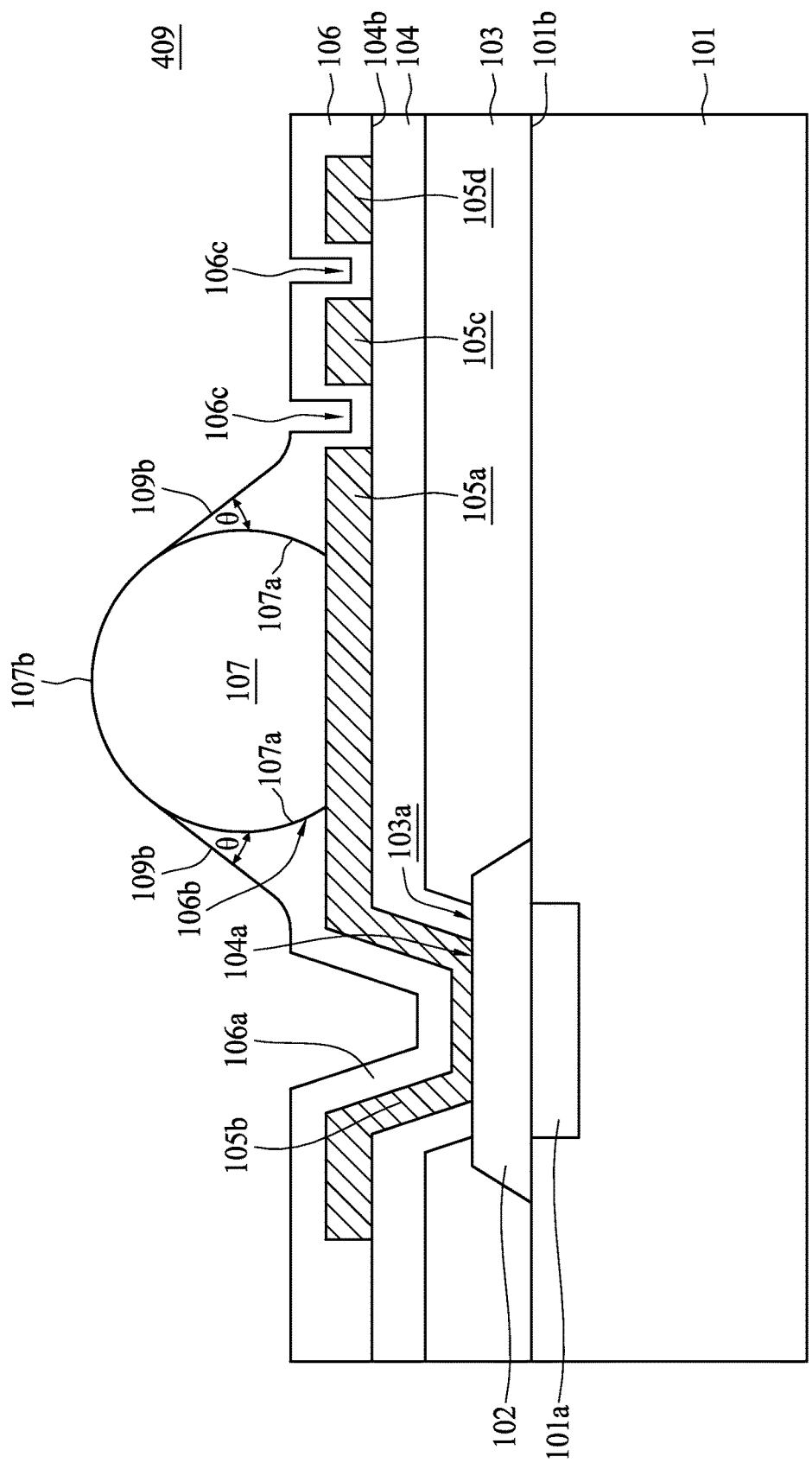
FIG. 4I is a schematic view of a polymeric layer on a PPI in accordance with some embodiments of the present disclosure.

In operation 409, a polymeric layer 106 is formed on the PPI 105 as in FIG. 4I. In some embodiments, the polymeric layer 106 is conformal to the pad portion 105a, the via portion 105b and the conductive line (105c, 105d) of the PPI 105. In some embodiments, the polymeric layer 106 is formed by spin coating or any other suitable operations.

In some embodiments, the polymeric layer 106 forms a first recessed portion 106a, a second recessed portion 106b and a third recessed portion 106c. In some embodiments, the first recessed portion 106a is formed within the via portion 105b. In some embodiments, a profile of the first recessed portion 106a is substantially same as a profile of the second via 104a.

In some embodiments, the polymeric layer 106 forms a second recessed portion 106b surrounding the bump 107.

The second recessed portion 106b surrounds an encapsulated portion 107a of an outer surface of the bump 107. There is an exposed portion 107b of the outer surface of the bump 107 exposing from the second recessed portion 106b or the polymeric layer 106.

In some embodiments, the polymeric layer 106 forms at least one third recessed portion 106c between the conductive line (105c, 105d). In some embodiments, the third recessed portion 106c is disposed between the pad portion 105a and the conductive line (105c, 105d). In some embodiments, the third recessed portion 106c is disposed between each of first elongated members 105c and each of second elongated members 105d. In some embodiments, the third recessed portion 106c is conformal to a profile of each of the first elongated members 105c and each of the second elongated members 105d.

Figure 4J:
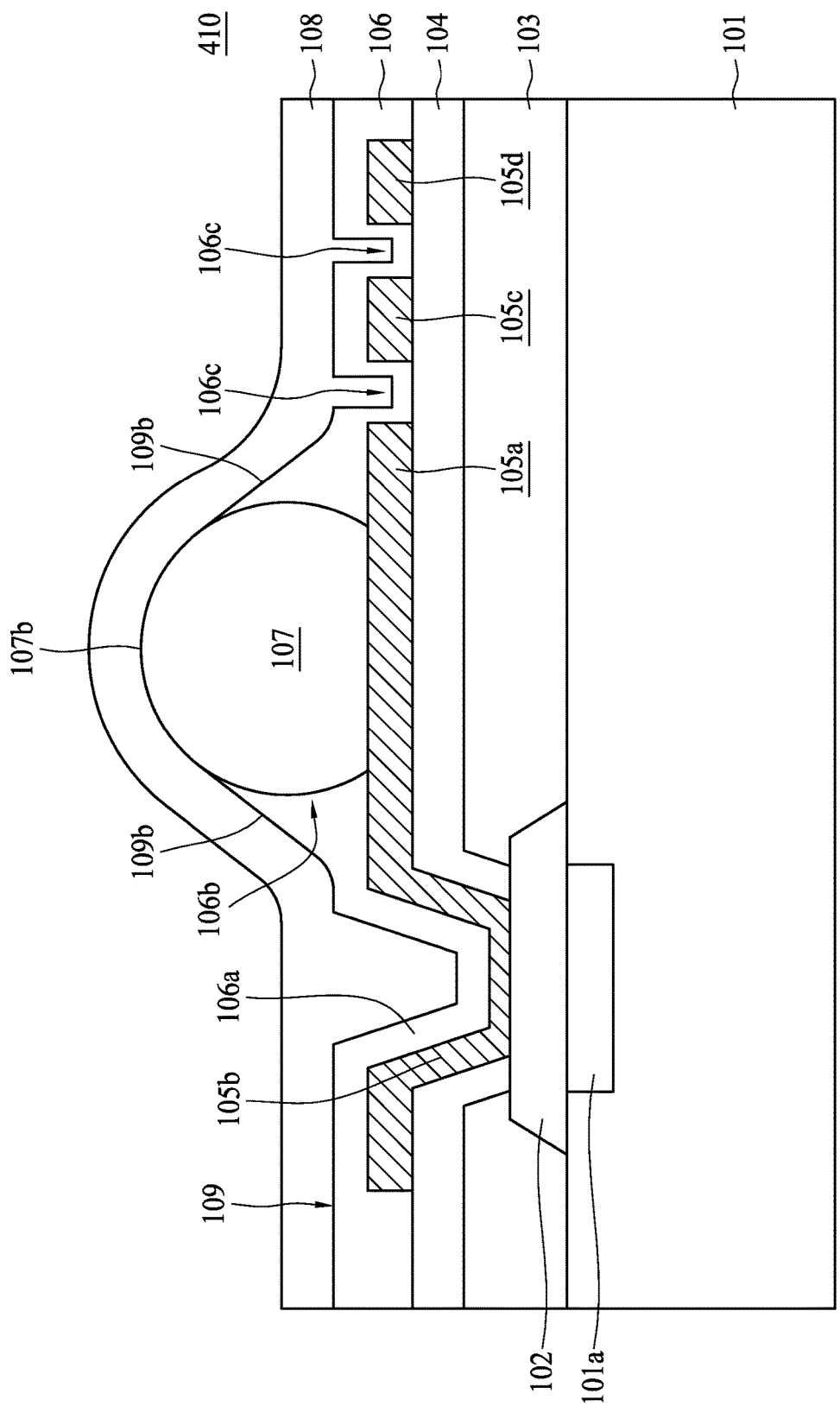
FIG. 4J is a schematic view of a molding on a polymeric layer in accordance with some embodiments of the present disclosure.

In operation 410, a molding 108 is formed on the polymeric layer 106 as in FIG. 4J. In some embodiments, the molding 108 is disposed by covering the polymeric layer 106 and the exposed portion 107b of the bump 107. The molding 108 fills a gap between the PPI 105 and the conductive line (105c, 105d). In some embodiments, the molding 108 is disposed by compression molding or any other suitable operations.

In some embodiments, there is an interface 109 between the polymeric layer 106 and the molding 108. In some embodiments, the interface 109 includes a curved portion 109b. In some embodiments, there is an angle θ between the outer surface of the bump 107 and the curved portion 109b of the interface 109.

Figure 4K:
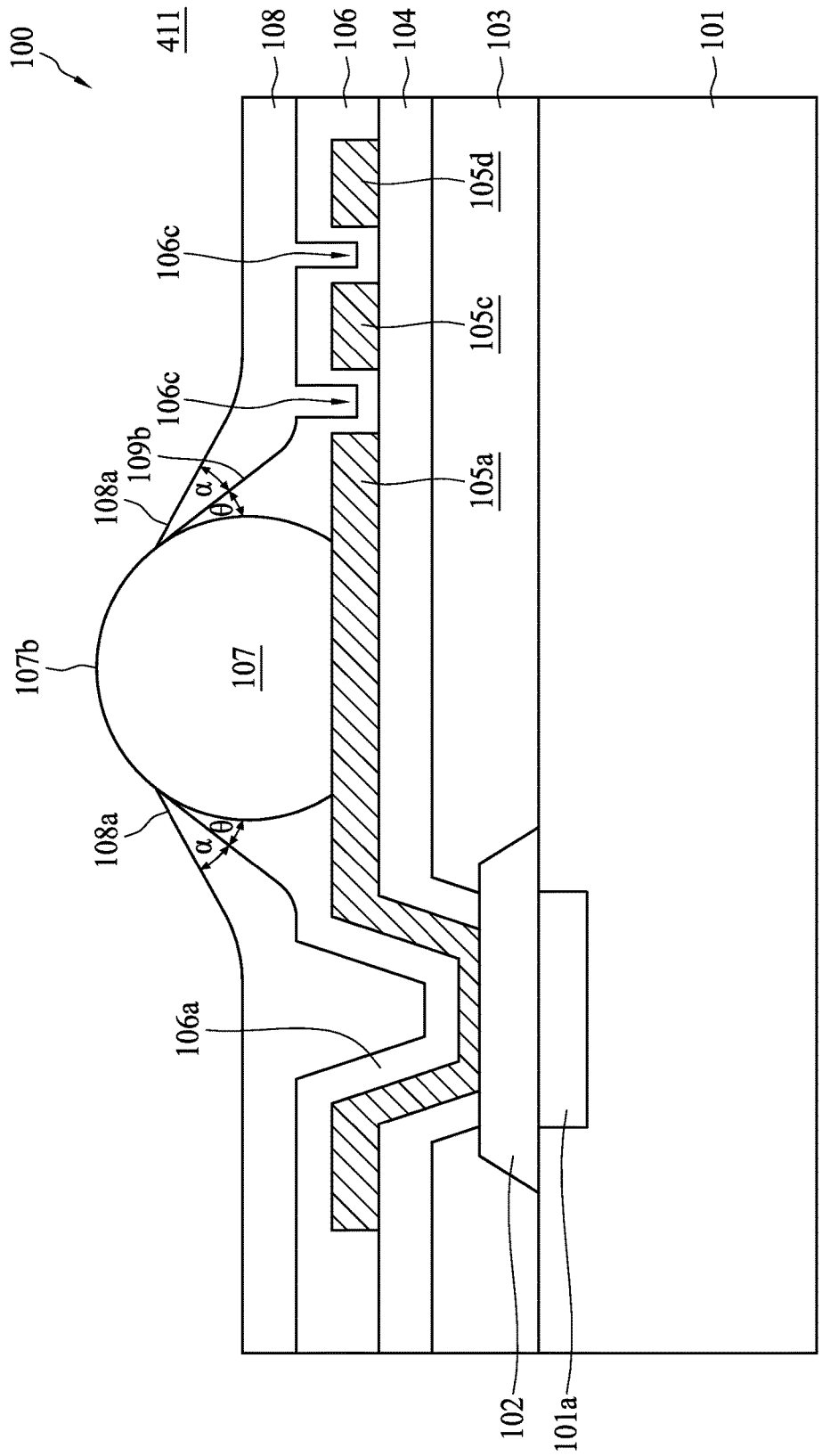
FIG. 4K is a schematic view of a bump exposed from a molding in accordance with some embodiments of the present disclosure.

In operation 411, some of the molding 108 is removed by a plasma treatment to expose the exposed portion 107b of the bump 107 as in FIG. 4K. In some embodiments, some of the molding 108 adjacent to the exposed portion 107b is removed by bombardment of plasma ions such as nitrogen ions. In some embodiments, a curved surface 108a of the molding 108 is formed proximal to the outer surface of the bump 107 after the removal of some of the molding 108.

In some embodiments, there is an angle α between the curved surface 108a of the molding 108 and the curved portion 109b of the interface 109. The angle α surrounds the outer surface of the bump 107. In some embodiments, a semiconductor device 100 of FIG. 1 is formed after the operation 311.

Figure 4L:
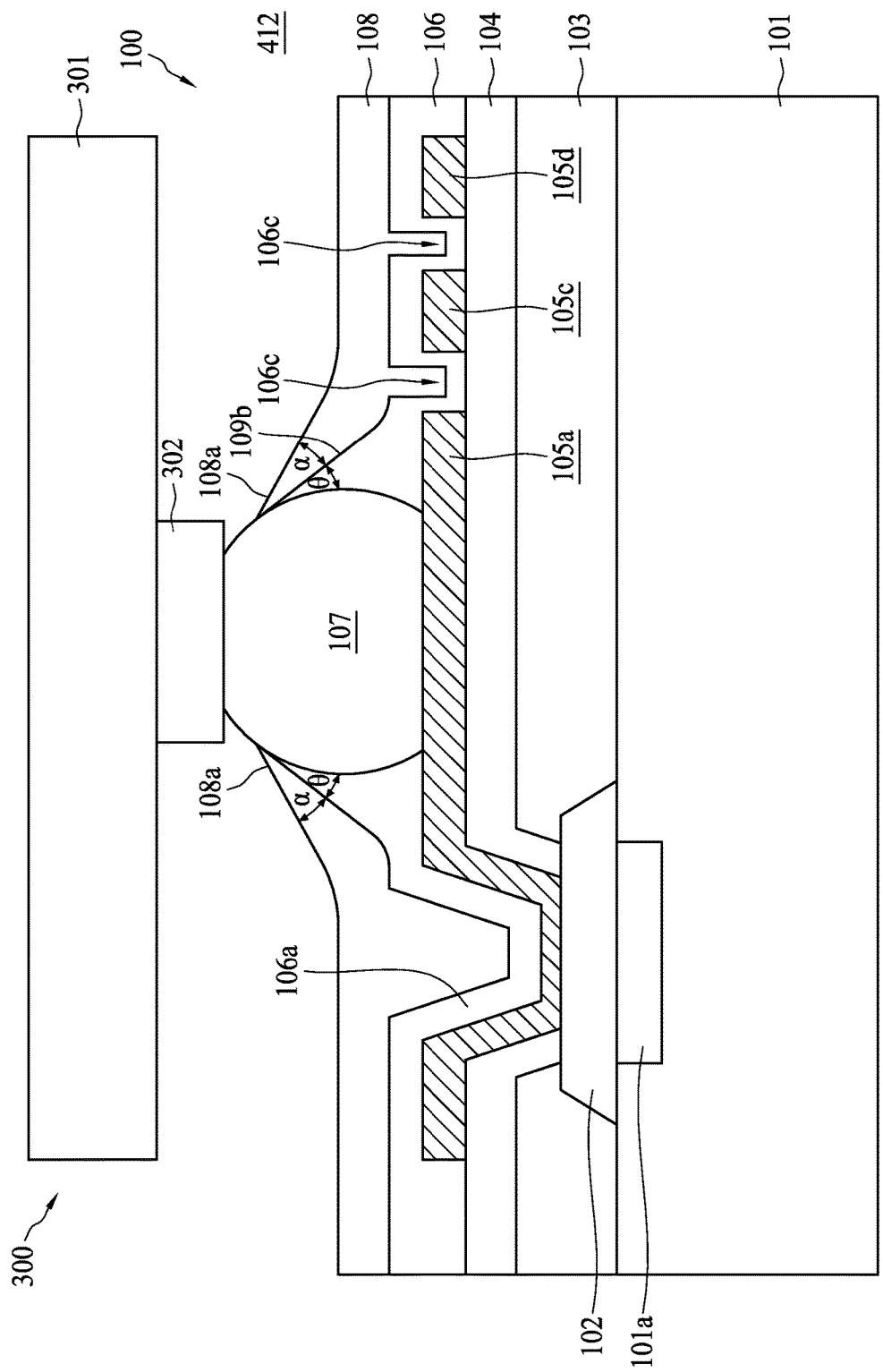
FIG. 4L is a schematic view of a semiconductor device bonded with another semiconductor device or semiconductor package in accordance with some embodiments of the present disclosure.

In operation 412, the semiconductor device 100 is bonded with another semiconductor device 300 as in FIG. 4L. In some embodiments, the semiconductor device 300 is a PCB or a semiconductor package. In some embodiments, the semiconductor device 300 includes a substrate 301 including a circuit and a pad 302 disposed on the substrate 301. In some embodiments, the pad 302 is disposed on a surface of the substrate 301 by electroplating, sputtering or any other suitable operations.

In some embodiments, the bump 107 of the semiconductor device 100 is melted by heat treatment such as reflowing, and then the molten bump 107 is attached on the pad 302 of the semiconductor device 300. As such, the bump 107 is bonded with the pad 302 after cooling operations. Thus, the semiconductor device 300 is mounted on the semiconductor device 100, and the circuit of the substrate 301 is electrically connected with the circuit of the substrate 101 through the pad 102, the PPI 105, the bump 107 and the pad 302.

In some embodiments, a semiconductor device includes a substrate, a pad disposed on the substrate, a passivation disposed over the substrate, a post passivation interconnection (PPI) disposed over the passivation and the substrate, a conductive line isolated from the PPI, a bump disposed on the PPI and a polymeric composite between the PPI and the conductive line, wherein the polymeric composite includes a first layer conformal to the conductive line and PPI and a second layer filling a gap between the PPI and the conductive line.

In some embodiments, the second layer of the polymeric composite has a curved surface adjacent to an outer surface of the bump. In some embodiments, the conductive line is surrounded by the polymeric composite. In some embodiments, the conductive line is electrically isolated from the PPI by the polymeric composite. In some embodiments, the bump is partially surrounded by the polymeric composite.

In some embodiments, the conductive line includes a plurality of first elongated members and a plurality of second elongated members interleaved with the plurality of first elongated members. In some embodiments, the polymeric composite includes a molding compound, polymer, epoxy, polyimide or polybenzoxazole (PBO). In some embodiments, the polymeric composite has a thickness of about 2 um to about 10 um. In some embodiments, the substrate includes a metallic structure disposed within or on the substrate and electrically connected with the pad.

In some embodiments, a semiconductor device includes a substrate, a passivation disposed over the substrate, a post passivation interconnection (PPI) disposed over the passivation and including a pad portion, a via portion and a conductive line, a bump disposed on the pad portion, a polymeric layer disposed over the PPI, a molding disposed on the polymeric layer, and an interface between the polymeric layer and the molding, wherein the interface includes a recessed portion extending within the via portion, a stepped portion conformal to an outer surface of the conductive line, and a curved portion with a curvature ramping from the pad portion to an outer surface of the bump.

In some embodiments, the curved portion has an angle with the outer surface of the bump. In some embodiments, an angle between the curved portion and the outer surface of the bump is about 10 degree to about 85 degree. In some embodiments, the recessed portion extends towards a bottom of the via portion. In some embodiments, the curved portion surrounds the bump. In some embodiments, the stepped portion is disposed between the pad portion and the conductive line.

In some embodiments, a method of manufacturing a semiconductor device includes providing a substrate, disposing a passivation over the substrate, forming a post passivation interconnect (PPI) and a conductive line over the passivation, disposing a bump on the PPI, and forming a polymeric composite over the PPI by disposing a first layer conformal to the PPI and the conductive line and disposing a second layer to fill a gap between the PPI and the conductive line.

In some embodiments, the first layer is disposed by spin coating, and the second layer is disposed by compression molding. In some embodiments, the forming the polymeric composite includes disposing the second layer on the bump and the PPI, and removing some of the second layer by plasma treatment to expose a portion of the bump. In some embodiments, the forming the PPI includes forming a pad portion, a via portion and a conductive line simultaneously. In some embodiments, the forming the polymeric composite includes forming a curved surface of the second layer proximal to an outer surface of the bump.

The methods and features of this disclosure have been sufficiently described in the above examples and descriptions. It should be understood that any modifications or changes without departing from the spirit of the disclosure are intended to be covered in the protection scope of the disclosure.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein maybe utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the disclosure.

What is claimed is:

1. A semiconductor device, comprising:
a substrate;
a pad disposed on the substrate;
a passivation disposed over the substrate;
a post passivation interconnection (PPI) disposed over the passivation and the substrate and including a pad portion and a via portion;
a conductive line isolated from the PPI and disposed over the passivation;
a bump disposed on the PPI; and
a polymeric composite including a first layer disposed over the PPI and the conductive line, a second layer disposed over the first layer, and an interface between the first layer and the second layer,
wherein the bump is surrounded by the first layer and the second layer, is interfaced with the first layer and is at least partially exposed from the first layer and the second layer, the interface includes a recessed portion extending within the via portion, a stepped portion conformal to an outer surface of the conductive line, and a curved portion with a curvature ramping from the pad portion to an outer surface of the bump.

2. The semiconductor device of claim 1, wherein the second layer of the polymeric composite has a curved surface adjacent to an outer surface of the bump.

3. The semiconductor device of claim 1, wherein the conductive line is surrounded by the polymeric composite.

4. The semiconductor device of claim 1, wherein the conductive line is electrically isolated from the PPI by the polymeric composite.

5. The semiconductor device of claim 1, wherein the curved portion is in a shape of an exponential curve or a bell shaped curve.

6. The semiconductor device of claim 1, wherein the conductive line includes a plurality of first elongated members and a plurality of second elongated members interleaved with the plurality of first elongated members.

7. The semiconductor device of claim 1, wherein the polymeric composite includes a molding compound, polymer, epoxy, polyimide or polybenzoxazole (PBO).

8. The semiconductor device of claim 1, wherein the polymeric composite has a thickness of about 2 um to about 10 um.

9. The semiconductor device of claim 1, wherein the substrate includes a metallic structure disposed within or on the substrate and electrically connected with the pad.

10. A semiconductor device, comprising:
a substrate;
a passivation disposed over the substrate;
a post passivation interconnection (PPI) disposed over the passivation and including a pad portion, a via portion and a conductive line;
a bump disposed on the pad portion;
a polymeric layer disposed over the PPI;
a molding disposed on the polymeric layer; and
an interface between the polymeric layer and the molding,
wherein the bump is surrounded by the polymeric layer and the molding interfaced with the polymeric layer and is at least partially exposed from the polymeric layer and the molding, the interface includes a recessed portion extending within the via portion, a stepped portion conformal to an outer surface of the conductive line, and a curved portion with a curvature ramping from the pad portion to an outer surface of the bump.

11. The semiconductor device of claim 10, wherein the curved portion has an angle with the outer surface of the bump.

12. The semiconductor device of claim 10, wherein an angle between the curved portion and the outer surface of the bump is about 10 degree to about 85 degree.

13. The semiconductor device of claim 10, wherein the recessed portion extends towards a bottom of the via portion.

14. The semiconductor device of claim 10, wherein the curved portion surrounds the bump.

15. The semiconductor device of claim 10, wherein the stepped portion is disposed between the pad portion and the conductive line.

16. A method of manufacturing a semiconductor device, comprising:
providing a substrate;
disposing a passivation over the substrate;
forming a post passivation interconnect (PPI) including a pad portion, a via portion and a conductive line over the passivation;
disposing a bump on the PPI;
disposing a polymeric layer over the PPI; and
disposing a molding over the polymeric layer,
wherein the bump is surrounded by the polymeric layer and the molding, is interfaced with the polymeric layer and is at least partially exposed from the polymeric layer and the molding, an interface is formed between the polymeric layer and the molding, the interface includes a recessed portion extending within the via portion, a stepped portion conformal to an outer surface of the conductive line, and a curved portion with a curvature ramping from the pad portion to an outer surface of the bump.

17. The method of claim 16, wherein the polymeric layer is disposed by spin coating, and the molding is disposed by compression molding.

18. The method of claim 16, further comprising removing some of the molding by plasma treatment to expose a portion of the bump.

19. The method of claim 16, wherein the pad portion, the via portion and the conductive line are formed simultaneously.

20. The method of claim 16, wherein the disposing the molding includes forming a curved surface proximal to an outer surface of the bump.

* * * * *